United States Patent [19]

Clark, Jr.

[11] Patent Number: 6,049,090
[45] Date of Patent: Apr. 11, 2000

[54] SEMICONDUCTOR PARTICLE ELECTROLUMINESCENT DISPLAY

[75] Inventor: Harry R. Clark, Jr., Townsend, Mass.

[73] Assignee: Massachusetts Institute of Technology, Cambridge, Mass.

[21] Appl. No.: 08/797,063

[22] Filed: Feb. 10, 1997

[51] Int. Cl.[7] ............................. H01L 33/00; H01L 29/06
[52] U.S. Cl. .................................. 257/13; 257/17; 257/94
[58] Field of Search .................................... 257/13, 17, 94

[56] References Cited

U.S. PATENT DOCUMENTS

| 3,919,589 | 11/1975 | Hanak ........................................ | 315/71 |
| 4,931,692 | 6/1990 | Takagi et al. ........................... | 313/503 |
| 5,156,885 | 10/1992 | Budd ........................................ | 427/70 |
| 5,253,258 | 10/1993 | Lawandy .................................. | 372/22 |
| 5,434,878 | 7/1995 | Lawandy .................................. | 372/43 |
| 5,442,254 | 8/1995 | Jaskie ...................................... | 313/485 |
| 5,448,582 | 9/1995 | Lawandy .................................. | 372/42 |
| 5,455,489 | 10/1995 | Bhargava ............................. | 315/169.4 |
| 5,690,807 | 11/1997 | Clark, Jr. et al. ....................... | 205/655 |

FOREIGN PATENT DOCUMENTS

| 0622439 | 11/1994 | European Pat. Off. ........ | C09K 11/00 |

OTHER PUBLICATIONS

Canham, "Silicon quantum wire array fabrication by electrochemical and chemical dissolution of wafers," *Appl. Phys. Lett.*, vol. 57, No. 10, pp. 1046–1048, Sep. 3, 1990.

DiMaria et al., "Electroluminescence studies in silicon dioxide films containing tiny silicon islands," *J. Appl. Phys.*, vol. 56, No. 2, pp. 401–416, Jul. 15, 1984.

Colvin et al., "Light–emitting diodes made from cadmium selenide nanocrystals and a semiconducting polymer," *Nature*, vol. 370, pp. 354–357, Aug. 4, 1994.

Wang et al., "Enhancement of organic electroluminescent intensity by charge transfer from guest to host," *Journal of Luminescence*, vol. 68, pp. 49–54, 1996.

Schoenfeld et al., "Formation of nanocrystallites in amorphous silicon thin films," *Journal of Crystal Growth*, vol. 142, pp. 268–270, 1994.

Kolobkova et al., "Phosphate Glasses Doped with CdS Nanocrystals," *phys. stat. sol.* (*a*), vol. 147, pp. K65–K68, 1995.

(List continued on next page.)

*Primary Examiner*—Jerome Jackson, Jr.
*Attorney, Agent, or Firm*—Theresa A. Lober

[57] ABSTRACT

An electroluminescent display device having a semiconductor host matrix which is characterized by a conduction band energy level, a valence band energy level, and a bandgap energy corresponding to an energy difference between a minima of the conduction band and a maxima of the valence band energy levels. Semiconductor particles are disposed in the semiconductor host matrix, and at least a portion of these semiconductor particles are characterized by a conduction band energy level that is less than that of the host matrix. These semiconductor particles are further characterized by a valence band energy level and a bandgap energy, corresponding to an energy difference between a minima of the conduction band and a maxima of the valence band energy levels of the particles, that is less than the bandgap energy of the semiconductor host matrix. There is included in the display configuration a mechanism for providing electrons and holes at locations of the semiconductor particles, by way of conduction through the semiconductor host matrix, for recombination at the particle locations, between the conduction band minima and the valence band maxima of the particles, to produce luminescent radiation. With a semiconductor host matrix that enables conduction of holes and electrons freely through it, the electroluminescent display of the invention overcomes the severe quantum efficiency limitations imposed by conventional luminescent display configurations.

23 Claims, 1 Drawing Sheet

OTHER PUBLICATIONS

Bhargava et al., "Doped nanocrystals of semiconductors—a new class of luminescent materials," *Journal of Luminescence,* vols. 60&62, pp. 275–280, 1994.

Kavan et al., "Quantum Size Effects in Nanocrystalline Semiconducting $TiO_2$ Layers Prepared by Anodic Oxidative Hydrolysis of $TiCl_3$," *J. Phys. Chem.,* vol. 97, No. 37, pp. 9493–9498, 1993.

Yan et al., "Photoluminescence spectra of $C_{60}$ molecules embedded in porous Si," *Appl. Phys. Lett.,* vol. 67, No. 23, pp. 3471–3473, Dec. 4, 1995.

Chiu et al., "Gas Phase Synthesis & Processing of Si nanocrystallites: Characterization by Photoluminescence Emission Spectroscopy," *Jnl. Elec. Mats.,* V. 23, N. 3, pp. 347–354, 1994.

Alivisatos, "Semiconductor Nanocrystals," *MRS Bulletin,* pp. 23–31, Aug. 1995.

Yu et al., "Optical properties and characteristics of ZnS nanoparticles with homogeneous Mn Distribution," *Jnl. Of Physics and Chemistry of Solids,* vol. 57, No. 4, pp. 373–379, Apr. 1996.

Hirler et al., "Spatially direct and indirect optical transitions in shallow etched GaAs/AlGaAs wires, dots, and antidots," *Semiconductor Sci. Technol.,* vol 8, No. 4, pp. 617–621, Apr. 1993.

Arakawa et al., "Fabrication and optical properties of GaAs quantum wires and dots by MOCVD Selective growth," *Semiconductor Sci. Technol.,* vol. 8, No. 4, pp. 1082–1088, Apr. 1993.

Bhargava et al., "Optical Properties of Manganese–Doped Nanocrystals of ZnS," *Phys. Review Lett.,* vol. 72, No. 3, pp. 416–419, Jan. 17, 1994.

Mäder et al., "Effects of atomic clustering on the optical properties of III–V alloys," *Appl. Phys. Lett.* vol. 64, No. 21, pp. 2882–2884, May 23, 1994.

Gorelenok et al., "Pure green ($\lambda$=555nm) luminescence of GaP:Y epitaxial layers," *Semiconductors,* vol. 30, No. 3, pp. 269–271, Mar. 1996.

Bawendi et al., "The quantum mechanics of larger semiconductor clusters ('quantum dots')," *Annu. Rev. Phys. Chem.,* vol. 41, pp. 477–496, 1990.

Juen et al., "Technology and photoluminescence of GaAs Micro–and Nanocrystallites," *Superlattices and Microstructures,* vol. 11, No. 2, pp. 181–183, 1992.

Littau et al., "A Luminescent Silicon Nanocrystal Colloid via a High–Temperature Aerosol Reaction," *J. Phys. Chem.,* vol. 97, pp. 1224–1230, 1993.

Fojtik et al., "Luminescent colloidal silicon particles," *Chemical Physics Letters,* vol. 221, pp. 363–367, Apr. 29, 1994.

Zhao et al., "Observation of Direct Transitions in Silicon Nanocrystallites," *Jpn. J. Appl. Phys.,* vol. 33, Part 2, No. 7A, pp. L899–L901, Jul. 1, 1994.

Brittan, "Shedding Light on the Nanoworld," MIT Reporter, Technology Review, pp. 10, 12, Aug./Sep., 1996.

Kher et al., "A Straightforward, New Method for the Synthesis of Nanocrystalline GaAs and GaP," *Chem. Mater.,* vol. 6, No. 11, pp. 2056–2062, 1994.

Hagfeldt et al., "Light–Induced Redox Reactions in Nanocrystalline Systems," *Chem. Rev.,* vol. 95, No. 1, pp. 49–68, 1995.

Lin et al., "Synthesis of GaN by N ion implantation in GaAs (001)," *Appl. Phys. Lett.,* vol. 68, No. 18, pp. 2699–2701, Oct. 30, 1995.

Lin et al., "Size–dependent thermodynamic and electronic properties of individual nanometer–size gold clusters," *Physics & Chemistry of Finite Systems,* Jena et al. Eds., vol. 1, pp. 309–322, 1992.

Khosravi et al., "Manganese doped zinc sulphide nanoparticles by aqueous method," *Appl. Phys. Lett.,* vol. 67, No. 17, pp. 2506–2508, Oct. 23, 1995.

Furukawa et al., "Quantum size effects on the optical band gap of microcrystalline Si:H," *Physical Review B,* vol. 38, No. 8, pp. 5726–5729, Sep. 15, 1988.

Reed, "Quantum Dots," *Scientific American,* pp. 118–123, Jan. 1993.

Wells et al., "Synthesis of Nanocrystalline Indium Arsenide and Indium Phosphide from Indium (III) Halides and Tris(trimethylsilyl)pnicogens. Synthesis, Characterization, and Decomposition Behavior of $I_3In \cdot P(SiMe_3)_3$," *Chem. Mater.* vol. 7, No. 4, pp. 793–800, 1995.

Lippens et al., "Optical properties of II–VI semiconductor nanocrystals," *Semiconductor Science and Technology,* vol. 6, No. 9A, pp. A157–A160, Sep. 1991.

SEMICONDUCTOR PARTICLE ELECTROLUMINESCENT DISPLAY

GOVERNMENT RIGHTS IN THE INVENTION

The United States Government has rights to this invention pursuant to Air Force Contract No. F19628-95-C-0002.

BACKGROUND OF THE INVENTION

This invention relates to electroluminescent display configurations, and more particularly relates to electroluminescence of semiconductor particles employed in an electroluminescent display configuration.

Electroluminescence is a well-characterized semiconductor phenomenon in which optical radiation, e.g., ultraviolet, visible, or infrared radiation, is generated by a radiative electron-hole recombination mechanism in a semiconductor material through which an electric current is passed under application of an electric field. The radiative electron-hole recombination mechanism is characterized, in a common manifestation of the electroluminescence phenomenon, by an interband transition between the conduction band minima and the valence band maxima of the semiconductor material, whereby the wavelength of luminescent radiation closely corresponds to the bandgap energy between the conduction and valence bands. It has been recognized that this wavelength-specific radiation phenomenon can be exploited to produce an electroluminescent optical display in which a semiconductor material is configured for generating a visible-light, optical display pattern. In one simple example, a powder of a semiconductor, e.g., ZnS, is embedded in a dielectric matrix such as plastic or glass to form an electroluminescent display; application of an alternating electric field to the embedded particles results in visible luminescence of the particles.

The electroluminescence properties of semiconductor particles, such as the ZnS powder just mentioned, have been of increasing interest due to the optical characteristics exhibited by semiconductor particles. Specifically, it has been found that the optical characteristics of semiconductor particles can be quite disparate from that of the corresponding bulk semiconductor material, with semiconductor particles exhibiting enhanced luminescence capabilities.

In this regard, silicon particles have been of particular interest. Bulk silicon exhibits only a very low level of electroluminescence due to its bandgap configuration. Bulk silicon is characterized by a bandgap energy of about 1.1 eV and a bandgap topology in which the conduction band minima and the valence band maxima are at differing wave vectors, i.e., the bandgap is indirect. As is well known, a radiative electron-hole recombination transition across this indirect bandgap does not conserve crystal momentum and thus the transition cannot occur unless a phonon or other scattering agent is provided for the required momentum conservation. The probability for this transition is thus extremely small unless extrinsic recombination centers are incorporated in the bulk material to enhance the radiative process; and as a result, the corresponding quantum efficiency of bulk silicon luminescent processes is quite low. Beyond the indirect nature of the bulk silicon bandgap, the relatively small energy of the bandgap results in a bulk silicon luminescent radiation wavelength that is in the infrared range, rather than more preferably visible range, of the electromagnetic spectrum.

It has been well-established that in great contrast with bulk silicon material, silicon particles exhibit electroluminescence at a range of wavelengths and do so with an enhanced quantum efficiency over that of the bulk material. These striking differences in electroluminescent performance are generally ascribed to two cooperating phenomena that are both characteristic of quantum effects enabled by the size regime of the silicon particles. With regard to a first of these quantum phenomena, it has been shown that silicon particles, as well as semiconductor particles in general, undergo a broadening of energy bands as the size of the particles is decreased. The bandgap of the particles correspondingly increases with the band broadening, with the specific bandgap of a particle depending on that particle's size. Based on this phenomenon, semiconductor particles, including silicon particles, can be engineered to provide a particle size regime corresponding to a band gap that enables a desired luminescence wavelength, including visible wavelengths.

With regard to the second of the quantum phenomena, it has been shown that the indirect nature of the bulk silicon bandgap is altered in correspondence with silicon particle size. Specifically, at nanometer particle sizes, the molecular orbital bonding arrangement characteristic of the particle size dictates a direct, rather than indirect, silicon bandgap. Nanometer-sized silicon particles have indeed been empirically found to have a bandgap that is shifted from that of an indirect topology to that of a direct topology. As a result, the electroluminesence quantum efficiency of silicon nanoparticles is understood to theoretically far exceed that of bulk silicon.

There have been proposed a wide range of configurations for exploiting the enhanced electroluminescence phenomena of silicon and other semiconductor particles, to produce a viable visible-wavelength electroluminescent display. For example, the bulk silicon topology known as porous silicon, produced by, e.g., anodic etching of bulk silicon, has been shown to have jagged columnar pores in the bulk material that can luminesce at a range of visible wavelengths, as described by Canham in *Appl. Phys. Lett.,* V. 57, pp. 1046, 1990. It has been suggested that the columnar asperities of the pores luminesce in the manner of isolated nanometeric-sized particles. But porous silicon is found to be a suboptimal electroluminescent configuration in that the bulk silicon surrounding the columnar pores tends to absorb radiation produced at the pores, whereby the overall efficiency of the configuration is found to be relatively low. The silicon radiation absorption properties are also found to be wavelength specific, and to favor shorter wavelengths; as a result, even low efficiency porous silicon electroluminescence is found to be confined to the low energy, long-wavelength end of the visible spectrum.

A further proposed class of electroluminescent configurations is based on incorporation of isolated silicon or other semiconductor particles in an insulating layer such as silicon dioxide, as in the manner of the ZnS powder configuration mentioned above. The silicon dioxide layer maintains physical and electrical separation between the semiconductor particles and enforces an electron tunneling transport mechanism between the particles, as described by DiMaria et al., in "Electroluminescence studies in silicon dioxide films containing tiny silicon islands," *J. Appl. Phys.,* V. 56, N. 2, pp. 401–416, July 1984. In this configuration, application of a voltage across a silicon dioxide layer containing silicon particles results in the probabilistic tunneling of injected electrons through the characteristically wide bandgap of the insulating layer from semiconductor particle to particle, with electron-hole recombination and corresponding luminescence occurring at the particles.

The electron tunneling phenomenon, known specifically as field-enhanced Fowler-Nordheim tunneling, that is enforced in this dielectric configuration sets an upper bound on the achievable luminescent quantum efficiency of the configuration. The process of electron tunneling is inherently inefficient, and is a highly probabilistic function of local bandgap conditions. As a result, the tunneling probability associated with the wide bandgap insulating layer, rather than the luminescence characteristic of the silicon particles, is found to be the dominant limiting factor in the overall quantum efficiency of this configuration. Thus, like the porous silicon configuration described above, the insulating layer configuration here limits the ability to exploit the silicon particle electroluminescence capabilities. Indeed, it has been found in general that electroluminescent configurations proposed heretofore have not provided an enabling mechanism for exploiting the high-efficiency luminescence associated with semiconductor particles in general and silicon particles in particular.

SUMMARY OF THE INVENTION

The present invention overcomes limitations of prior semiconductor particle electroluminescent configurations to provide an electroluminescent display that does not degrade the high quantum efficiency luminescent capabilities inherent of semiconductor particles. Accordingly, the invention provides an electroluminescent display device having a semiconductor host matrix which is characterized by a conduction band energy level, a valence band energy level, and a bandgap energy corresponding to an energy difference between a minima of the conduction band and a maxima of the valence band energy levels. Semiconductor particles are disposed in the semiconductor host matrix, and at least a portion of these semiconductor particles are characterized by a conduction band energy level that is less than that of the host matrix. These semiconductor particles are further characterized by a valence band energy level and a bandgap energy corresponding to an energy difference between a minima of the conduction band and a maxima of the valence band energy levels of the particles. There is included in the display configuration a mechanism for providing electrons and holes at locations of the semiconductor particles for recombination at the particle locations, between conduction band minima and the valence band maxima of the particles, to produce luminescent radiation.

By providing a semiconductor host matrix that enables conduction of holes and electrons freely through it, the electroluminescent display of the invention overcomes the severe quantum efficiency limitation imposed by the probabilistic electron tunneling phenomena required of conventional dielectric-based display configurations. In turn, the overall theoretical quantum efficiency of the electroluminescent display of the invention is greatly increased over that of conventional dielectric-based displays. In addition, the electroluminescent voltage required for operation of the display of the invention is substantially lower than that required for a conventional dielectric-based display, due to the accommodation by the semiconductor host matrix of electron transport by conduction rather than probabilistic tunneling. By enabling direct and individual control of the particle semiconductor material bandgap and the host matrix semiconductor material bandgap, the electroluminescent display of the invention further is not inherently limited by radiation self-absorbance phenomena characteristic of porous silicon configurations.

In embodiments provided by the invention, the bandgap energy of the semiconductor particles is less than bandgap energy of the semiconductor host matrix and is between about 2 eV and about 4 eV; the electron-hole recombination time characteristic of the semiconductor host matrix is longer than an electron-hole recombination time characteristic of the semiconductor particles; and the wave vector of the semiconductor particle conduction band minima is coincident with the wave vector of the semiconductor particle valence band maxima.

In other embodiments provided by the invention, a portion of the semiconductor particles is characterized by a conduction band energy level that is distinct from the conduction band energy level of the other particles, and that is less than the conduction band energy level of the semiconductor host matrix. The semiconductor particles of this portion are further characterized by a valence band energy level that is distinct from the valence band energy level of the other particles, and a bandgap energy corresponding to an energy difference between a minima of the their conduction band and a maxima of the their valence band energy levels. In preferred embodiments, the bandgap energy of at least a portion of the semiconductor particles corresponds to a first selected wavelength of luminescent radiation to be produced by recombination of an electron and hole between the conduction band minima and the valence band maxima of those particles, with the bandgap energy of another portion of the particles corresponding to a second selected wavelength of luminescent radiation to be produced by recombination of an electron and hole between the conduction band minima and the valence band maxima of these other particles.

In other embodiments, the semiconductor host matrix includes a first host matrix portion characterized by corresponding conduction band and valence band energy levels and a bandgap energy as described above, and a second host matrix portion characterized by its own corresponding conduction band energy level, that is greater than the conduction band energy level of the semiconductor particles. The second host matrix portion further is characterized by a valence band energy level and a bandgap energy corresponding to an energy difference between a minima of the conduction band and a maxima of the valence band energy levels of the second host matrix portion.

In other embodiments, the semiconductor particles include a first portion of particles and a second portion of particles, with the first portion being characterized by a first average particle extent and the second portion being characterized by a second average particle extent. Preferably, with any number of portions, some semiconductor particles have an average particle extent that is less than about one micron, more preferably less than about 100 nanometers, more preferably less than about 10 nanometers, and more preferably less than about 1 nanometer.

In other embodiments, the semiconductor host matrix is a semiconducting polymer; the semiconductor particles can be silicon particles. The mechanism for providing electrons and holes to the semiconductor particles can be included as a mechanism for applying an electric field between ends of the semiconductor host matrix, such mechanism including, e.g., a circuit configured to apply a voltage across the semiconductor host matrix.

The electroluminescent display can be fabricated in any of a wide range of process techniques, including implantation of semiconductor particles into a semiconductor host matrix and annealing of the implanted particles by, e.g., laser annealing techniques. The particle implantation can be carried out in multiple steps, with each step being of a differing implant dose.

The electroluminescent display of the invention can be configured with a pixel array provided by location of semiconductor particles of differing bandgaps at specific sites on the semiconductor host matrix to produce a desired pixel color arrangement. The display is thus well-suited for a wide range of display applications including those in the visible, IR, and UV regions of the electromagnetic spectrum. Other features and advantages of the invention will be apparent from the claims, and from the following description and accompanying drawings.

DETAILED DESCRIPTION OF THE INVENTION

Figure 1:
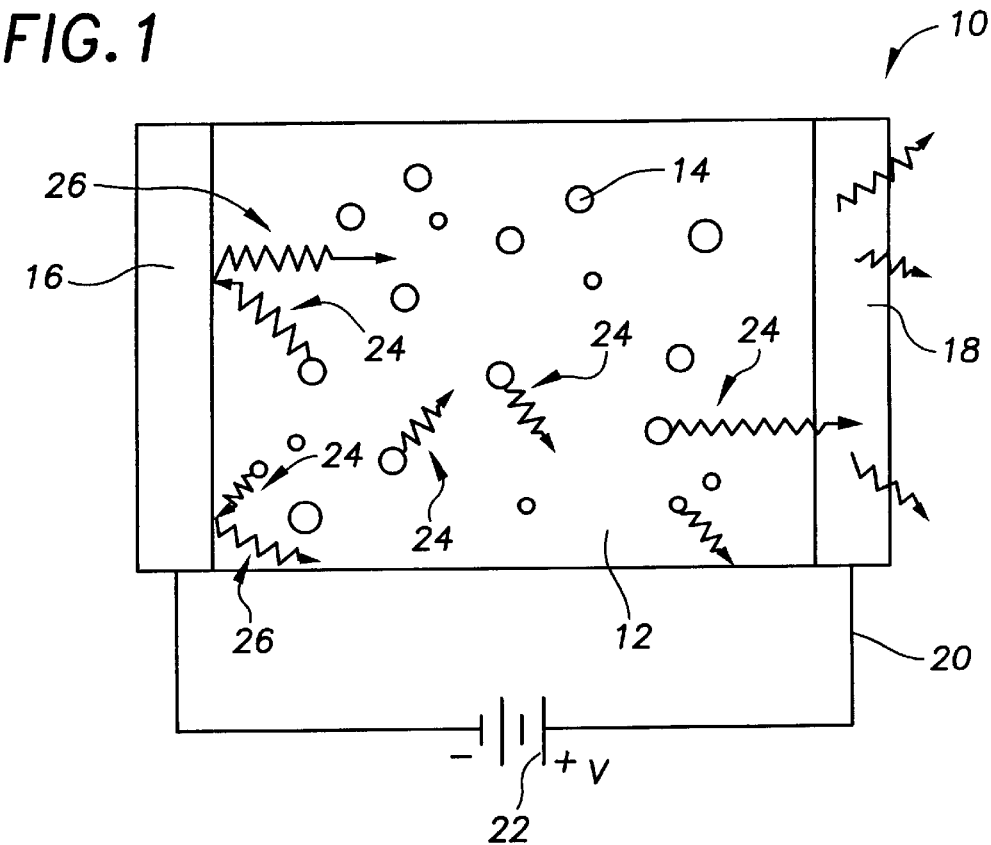
FIG. 1 is a schematic diagram of an electroluminescent display incorporating narrow bandgap semiconductor particles in a wide bandgap semiconductor host matrix in accordance with the invention.

Referring to FIG. 1 there is shown an example implementation of an electroluminescent display 10 configured in accordance with the invention. The display 10 includes a semiconductor host matrix 12 in which are embedded particles 14 of a semiconductor material different from that of the host matrix semiconductor material. A back electrical contact 16 is provided in contact with the back end of the host matrix 12 and preferably is formed of a reflective metal; while a front electrical contact 18 is provided in contact with the front end of the host matrix 12 and preferably is formed of a transparent or semi-transparent layer. A connection 20 is provided between the front and back contacts to apply a voltage, V, across the host matrix 12 with a voltage supply 22.

Figure 2:
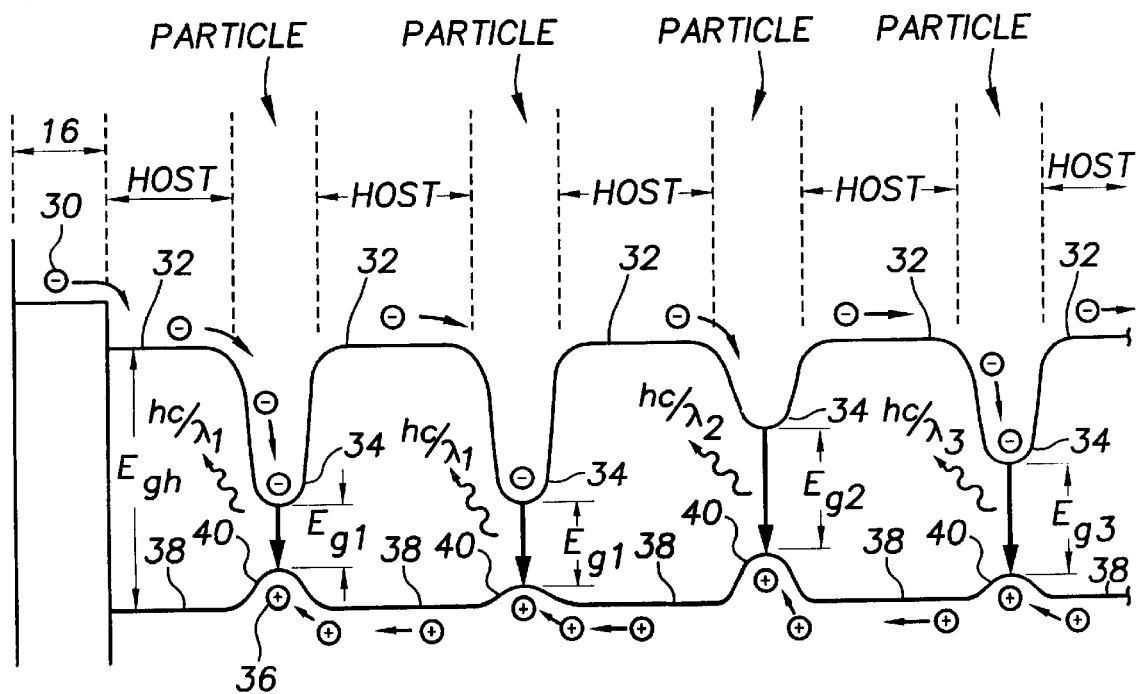
FIG. 2 is a schematic energy band diagram of the electroluminescent display of FIG. 1.

The semiconductor material of the host matrix 12 is characterized as having a larger bandgap, and correspondingly higher conduction band minima, than the bandgap and conduction band minima of the semiconductor particles 14. Referring also to FIG. 2, which schematically plots the conduction and valence band levels of the host matrix and particles along a line from left to right across the display, this bandgap disparity enables the following operation of the display 10. With the voltage source polarity 22 applied as shown in FIG. 1, electrons 30 are injected by way of the back contact 16 to the host matrix 12. The host matrix semiconductor conduction band 32 accommodates transport of the electrons 30 by way of conduction freely in all directions throughout the matrix 12; this electron conduction will on average tend toward the front electrode 18 (from left to right in FIG. 2), given the voltage polarity shown in FIG. 1.

As an electron is transported by conduction through the host matrix, its arrival at a semiconductor particle 14 corresponds, as shown in FIG. 2, to arrival at a location of lower potential energy, i.e., a conduction band edge 34 of the semiconductor particle which by selection is lower than that of the surrounding host matrix semiconductor. The lower semiconductor particle conduction band, being spatially surrounded by the higher host matrix conduction band, acts to trap the electron at the particle location in the manner of a quantum well. Similarly, holes 36 transported throughout the host matrix 12 in the valence band 38 of the host matrix become trapped at locations of a higher valence band edge 40 corresponding to the valence band and physical location of the semiconductor particles.

Once trapped at a semiconductor particle location, an electron 30 and hole 36 recombine, resulting in luminescence at a wavelength, λ, corresponding to the bandgap energy, $E_g$, of the semiconductor particle, based on the relation:

$$E_g = hc/\lambda_g; \tag{1}$$

where h is the Planck constant, c is the speed of light, and $\lambda_g$ is the luminescent wavelength emitted for the given bandgap energy, $E_g$.

This electroluminescence mechanism at locations of particles in the host matrix is enforced by several preferable host matrix criteria. First, for a given luminescence wavelength or wavelengths of interest, the host matrix semiconductor material preferably is characterized by a bandgap which exceeds that bandgap corresponding to the shortest wavelength of interest. In other words, the host matrix semiconductor material is preferably selected such that any electron-hole recombination mechanisms that might occur in the host matrix do not correspond to a luminescence wavelength of interest. As can be recognized, during electron and hole transport through the host matrix, there is a finite probability that some degree of electron-hole recombination can occur in the matrix. Thus, if. e.g., visible wavelengths are of interest, the host matrix semiconductor material is preferably selected such that any luminescence of the host matrix is in, e.g., the ultraviolet region of the electromagnetic spectrum.

Luminescence at any wavelength in the host matrix is preferably minimized, however, by selecting a host matrix semiconductor material that is characterized by an electron-hole recombination rate, or correspondingly, an electron-hole recombination time, that is much lower than that of the particle semiconductor material. With this selection criterion, the corresponding distance that a given hole and an electron can travel in the host matrix before recombining is maximized, given other considerations, to maximize the probability of the hole and electron reaching a particle before recombining; while the time after which the electron and hole are trapped at a particle location but before the electron and hole recombine at the particle is minimized, to increase efficiency of the luminescence mechanism. By maximizing the proportion of particle luminescence and minimizing the proportion of host matrix luminescence, this recombination rate criterion also maximizes the proportion of luminescent radiation that is at a desired wavelength or range of wavelengths.

Indeed, a range of luminescent wavelengths can be produced by the display configuration by way of semiconductor particle size selection. As explained earlier, the extent of the bandgap of a semiconductor particle is directly impacted by the particle size, and in turn, as given in relation (1) above, sets the luminescent wavelength of the particle. As shown in FIG. 1, the semiconductor particles 14 embedded in the host matrix 12 can be provided in varying sizes based on a desired range of luminescent wavelengths. Advantageously, as described in detail below, particles of specific sizes can be intentionally located at specific points in the host matrix for producing a desired display pixel pattern that is wavelength-specific.

Turning again to FIG. 2, in an example of a multi-sized semiconductor particle configuration in accordance with the invention, a first luminescence wavelength, $\lambda_1$, is produced by particles characterized by a corresponding first bandgap, $E_{g1}$, while a second luminescence wavelength, $\lambda_2$, is produced by particles characterized by a corresponding second bandgap, $E_{g2}$, and a third luminescence wavelength, $\lambda_3$, is produced by particles characterized by a corresponding third bandgap, $E_{g3}$; any reasonable number of particle sizes and corresponding wavelengths can be provided. Note that for all three example cases given here the bandgap of the host semiconductor material, $E_{gh}$, is larger than the bandgap of the semiconductor particles. Additionally, the host matrix semiconductor material preferably is not characterized by an absorption affinity for any of the luminescent wavelengths of interest.

By providing a semiconductor host matrix that enables conduction of holes and electrons freely through it, the electroluminescent display of the invention overcomes the severe quantum efficiency limitation imposed by the probabilistic electron tunneling phenomena required of conventional dielectric-based display configurations. In turn, the overall theoretical quantum efficiency of the electroluminescent display of the invention is greatly increased over that of conventional dielectric-based displays. Indeed, the theoretical quantum efficiency of the electroluminescent display of the invention is about 10 times that of a dielectric-based display. Quantum efficiency is here intended as the number of photons produced by a display for a given number of electrons provided to the display.

In addition, the electroluminescent voltage required for operation of the display of the invention is substantially lower than that required for a conventional dielectric-based display, due to the accommodation by the semiconductor host matrix of electron transport by conduction rather than probabilistic tunneling. The dielectric tunneling phenomenon conventionally requires a rather high voltage, e.g., greater than about 120 V AC, due to the high potential barrier of conventional dielectrics such as silicon dioxide. In great contrast, for a given luminescence configuration, the display of the invention can require a voltage level that is between about only 5–40 V DC.

By enabling direct and individual control of the particle semiconductor material bandgap and the host matrix semiconductor material bandgap, the electroluminescent display of the invention further is not limited by radiation self-absorbance phenomena characteristic of porous silicon configurations. This not only increases the range of wavelengths that can be produced by the configuration, but increases the theoretical quantum efficiency of those wavelengths produced. The theoretical quantum efficiency of the electroluminescent display of the invention is abut 10 times that of a porous silicon-based display.

The electroluminescent display of the invention can be produced in a manner for achieving precise control of desired luminescent wavelength characteristics, as well as location of those luminescent wavelengths along the display. Given a particular luminescent wavelength or range of wavelengths of interest, the host matrix semiconductor material and particle semiconductor materials are selected. As explained earlier, it may be preferable for many applications that the host matrix not luminesce at the selected wavelengths; this enables a display having a sharp contrast between luminescing "pixel" locations, i.e., particle locations, and the display background. Advantageously, an increase in semiconductor bandgap corresponds to a decrease in luminescent wavelength, and given that it is preferred in the invention for the host matrix semiconductor to have a wider bandgap than the particle semiconductor, the host matrix semiconductor can be selected to luminesce only in the ultraviolet or lower region of the spectrum, with the particle semiconductor selected to luminesce in the optical region of the spectrum.

Example host matrix semiconductor materials include silicon carbide, gallium nitride, diamond, $TiAl_2O_3$, or other suitable semiconductor, including a doped semiconductor, such as doped sapphire, having a doping level that is selectively adjusted to achieve a selected band gap. Doped and undoped semiconducting polymer materials, such as polyphenylene vinylene (PPV), or other suitable polymer or matrix-based semiconducting material, can also be employed for the host matrix. Given a number of suitable host matrix semiconductor materials, it is preferred that that semiconductor material having the relatively longest recombination time be selected, to minimize host matrix luminescence as explained earlier.

The semiconductor particle material and particle size are selected to produce the desired luminescent wavelength or wavelengths for the display. Silicon, germanium, gallium arsenide, or other suitable semiconductor can be employed as the particle material. The selected particle semiconductor material can be doped with a suitable dopant type and concentration to enable "tuning" of a particle bandgap in concert with the bandgap "tuning" mechanism that is inherent in selection of a particle size. Based on relation (1) given above and the well-known size-dependent quantum confinement "particle in a box" formulation, as well as empirical trial, the particle size is adjusted in accordance with the invention for a given doping scenario to achieve a desired particle bandgap.

It is recognized by the inventor that some amount of empirical analysis can in some applications be required to ascertain the precise particle diameter needed for a given semiconductor material and given doping arrangement to enable a desired luminescent wavelength. Given the use of silicon as the semiconductor particle material, a semiconductor particle size of about 50 Å generally corresponds to luminsescent radiation at longer visible wavelengths, i.e., the red region of the visible spectrum, with increasingly smaller particle sizes corresponding to luminescent radiation at shorter visible spectrum wavelengths. However, it is noted that an arbitrarily small particle size cannot be supported by all semiconductor materials generally, and silicon in particular, and that some combination of semiconductor formulation and doping can be required to achieve luminescent particle radiation at shorter visible wavelengths, i.e., at the blue region of the visible spectrum. Semiconductor particles larger than about one micron do not generally tend to exhibit quantum confinement phenomena and accordingly are not candidates for size-based manipulation of their bandgap extent and topology.

For a selected semiconductor material and doping concentration, semiconductor particles of a selected size regime can be produced in a wide range of processes including plasma synthesis, ion implantation, laser ablation, chemo-mechanical milling, supercritical fluid nucleation and synthesis, or other suitable process One preferable process is described by Clark, Jr. et al., in U.S. patent application Ser. No. 08/510,802, entitled "Method for Producing Semiconductor Particles," filed Aug. 3, 1995, issued Nov. 25, 1997, as U.S. Pat. No. 5,690,807 the entirety of which is hereby incorporated by reference. In this process, semiconductor particles are produced by anodic etching of a corresponding bulk semiconductor material, with a suitable surfactant provided in the etch solution to minimize particle agglomeration and to enable precipitation of the etched particles out of the etch solution. As can be recognized, other processes for producing semiconductor particles can also be employed.

In accordance with the invention, semiconductor particles can be adapted to include surface conditions that produce surface states corresponding to energy levels that are below the host matrix conduction band minima but above the particle conduction band minima, to provide additional electron-hole recombination mechanisms that enhance the likelihood of recombination at locations of the particles. Example particle surface conditioning includes coating particles with, e.g., monolayers of a distinct species, such as silicon hydride; etching of particle surfaces to introduce surface defects; or other processing technique that produces surface states of energy levels less than the conduction band minima of the semiconductor host matrix. With this enhancement, it is noted that recombination mechanisms said to occur "at a particle site" in accordance with the invention are intended to refer to all recombination mechanisms related to a particle, including interior as well as surface recombination mechanisms.

Given the production and any desired processing of semiconductor particles, then in a first example display assembly process, tailored to a host matrix semiconductor polymer material, the semiconductor particles are mixed with a polymer and the resulting mixture is spun on, e.g., a wafer or other substrate, in the manner that a photoresist polymer is applied. This spin-application process enables a homogeneous distribution of the particles throughout the matrix. Once applied, the polymer can be cured or processed in another manner as is conventional. Other polymer application techniques can also be employed as prescribed by, e.g., a given polymer's flow characteristics.

The invention also contemplates a non-homogeneous semiconductor particle distribution in a host polymer for providing multi-wavelength, location-specific luminescence. The particles here can be of a common material but of differing sizes, can be of differing materials but a common size, or can be of both differing materials and differing sizes. In a first process that enables these combinations, one or more spin masks are produced corresponding to a wavelength-specific luminescent display pattern, with each mask corresponding to location of one wavelength and correspondingly, one particle size and/or particle material, on the display. For example, the display can be partitioned into an array of pixel areas, with each pixel area including one or more sub-pixel areas each designated for a different particle material and/or size to provide a distinct luminescent color. Each pixel area can include, e.g., a red sub-pixel, a green sub-pixel, and a blue sub-pixel, for enabling a conventional RGB display control scenario to produce a viewable spectrum of optical wavelengths using only these three emitted wavelengths.

In this scenario, a spin mask is produced for each of the three sub-pixel colors, and semiconductor particles of the appropriate size and the appropriate material for each of the colors are produced and separately mixed with a polymer. The three separate particle-polymer mixtures are then applied in sequence to, e.g., a wafer, with the corresponding spin mask employed at each application step to enable application of a given mixture only at those pixel or sub-pixel locations of the display for which a given particle size and type is needed. As can be recognized, this process accommodates different polymers as well as different particle sizes and types; each polymer mixture can thus include a different polymer or different polymer doping level that is selected based on the size and type of particles to be mixed with that polymer. For some display applications, a polymer mixture application technique other than spin-application can here be preferred; for example, dot matrix deposition techniques can be employed, to enable formation of very small pixel areas as well as very precise alignment between different color pixels, for producing a large scale, high-resolution multi-color luminescent display. Other location-dependent polymer mixture application techniques can also be employed.

In an alternative process for producing a display with location-specific polymer mixtures that include particles of differing characteristics, a polymer mixture of differing polymer composition, differing semiconducting particle types, and/or differing semiconductor particle sizes is applied to the a wafer or other suitable substrate, based on the techniques described above, and then a series of location-specific thermal or optical annealing steps, e.g., laser annealing steps, are carried out to anneal the particles at various display locations under annealing conditions tailored to a desired particle size for each location. Annealing of the particles causes the particles to grow, as is conventional, in proportion to the annealing conditions, and thus provides the ability to "tune" the bandgap, and corresponding luminescence wavelength, of the particles once they are embedded in the host matrix. Accordingly, the initial mixture particle size is preferably the smallest of all particle sizes desired, with the annealing conditions and times being determined for growing that particle size to other, larger sizes in successive annealing steps. The precise location control of the laser annealing technique enables separate annealing steps to be carried out in precise locations, resulting in formation of very small and precisely-aligned polymer regions having differing particle sizes. This technique is thus particularly well-suited for enabling precise location of selected display pixel and sub-pixel patterns. As can be recognized, other optical annealing processes, or alternatively, thermal annealing processes, can be employed.

In a second example display assembly process in accordance with the invention, the host matrix semiconductor is first produced and then the semiconductor particles are embedded in the host matrix. Here the host matrix can be grown, as in conventional bulk crystal growth, or can be epitaxially grown in layered form, e.g., by molecular beam epitaxy or other epitaxial process. The host matrix can alternatively be deposited on a foreign or homogeneous substrate by, e.g., chemical vapor deposition, plasma synthesis, sputtering, evaporation, or other film deposition and growth technique, including the wide range of vapor and liquid phase deposition techniques.

The semiconductor particles are then introduced to the host matrix by, e.g., ion implantation of the particles at a suitable energy and dose to achieve a desired implant density as well as depth distribution in the conventional manner. Multiple implantation steps can be carried out, each with a different semiconductor particle material and/or particle size, to achieve a lateral and/or depth-dependent distribution of differing luminescent locations in the host matrix, with suitable implantation masks employed in the manner of the spin masks described above. Whether a single or multiple semiconductor particle implant species are employed, multiple implant procedures each with either a common or differing particle size and type, and each with a differing dose, can be carried out in succession, with succeeding optical or thermal annealing procedures like that described above employed to produce a desired distribution of particle sizes. For example, a relatively heavy implant dose, then a lighter implant dose, and finally, a lightest implant dose, can be employed in a three-step location-specific implantation procedure; a single thermal annealing process applied to the entire implanted structure then results in production of large particles in the heavy-dose region, with smaller particles in the lighter-dose region, and smallest particles in the lightest-dose region. This process thus provides an uncomplicated technique with relatively few process steps for achieving location-specific particle size distribution in the host matrix. The laser annealing process described above can also be employed, as can be recognized.

In a further example display assembly process in accordance with the invention, the host matrix semiconductor is epitaxially grown or deposited and semiconductor particles are introduced to the host material at intervals of the growth or deposition. For example, a layer of the host semiconductor material can be epitaxially grown to some intermediate host matrix thickness in a first growth step, after which a first implantation step and optionally, a corresponding annealing step, is undertaken to embed semiconductor particles in the intermediate layer. The epitaxial growth process and implantation/annealing processes can then be iterated over the embedded particles to produce further intermediate host matrix thicknesses and embedded layers, based on the implantation and annealing steps described above. As can be recognized, various heteroepitaxial and other growth and deposition processes can be employed to in situ produce the embedded semiconductor particles as the host matrix material is produced; and other various deposition and growth processes can be employed as suitable. The invention does not require a specific deposition or growth process, and instead is limited only by the relative bandgap widths of the host semiconductor material and the semiconductor particle material. The semiconductor particles can thus be embedded in the host matrix in any desired spatial configuration, including as a surface layer on the host matrix, for achieving desired performance in a given application.

As is conventionally employed in the area of charge-coupled-device technology, a host matrix semiconductor having semiconductor particles embedded in it by any of the processes just described can include color filters, prisms, lens systems, or other suitable system, on the front surface or other suitable configuration in relation to the host matrix for enforcing specific, location-dependent, display colors. For example, one or more color-specific phosphorescent layers that are optically excited by semiconductor particle luminescence to produce phosphorescent radiation at wavelengths other than that produced by the particle luminescence can be located as sites on the host matrix in a desired pixel or sub-pixel pattern. As can be recognized, other such extrinsic wavelength tuning configurations can be employed for a desired display application.

Given a semiconductor host matrix produced with a selected distribution of semiconductor particles, the electroluminescent display of the invention is further assembled, as shown in FIG. 1, by providing a transparent front electrode 18 and a reflective back electrode 16 for applying a voltage across the host matrix to induce electron and hole transport through the matrix. An indium tin oxide layer, thin gold layer, or other suitable layer can be employed for the front electrode 18, which can include an optical or other coating for scattering light passing through the electrode to direct the light into a viewable volume. The back electrode 16 is preferably a reflective metal such as copper.

With this configuration, particle luminescence (24 in FIG. 1), i.e., radiated photons, originating at the semiconductor particles and directed toward the front electrode 18 pass through the front electrode for viewing on the front side of the display. Particle luminescence 24 that is directed toward the back electrode 16 is reflected by the back electrode, with the resulting reflected luminescence 26 directed toward the front of the display. As can be recognized, however, luminescent photons radiating from the semiconductor particles can take any path in the host matrix. It is therefore preferred, as is conventional, that sides of the display be coated with a reflective or other suitable coating, or attached to, e.g., angled prisms or mirrors, to direct the radiation toward the front of the display, for enhancing the overall efficiency of the display. Other display configurations can also be employed.

Whatever electrical contact configuration is employed, the electroluminescent display provided by the invention overcomes the quantum efficiency limitations of prior display configurations by employing a semiconductor host matrix that enables conduction of holes and electrons freely through the host matrix to semiconductor particle locations at which luminescent recombination events can efficiently occur. The theoretical quantum efficiency of the electroluminescent display is accordingly increased over that of conventional display configurations. The invention also provides a range of processing techniques that enable uncomplicated production of a multi-wavelength display pixel array for optical wavelength display patterns. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter of the claims and all equivalents thereof fairly within the scope of the invention.

I claim:

1. A visible-wavelength electroluminescent display device comprising:

a semiconductor host matrix characterized by a first conduction band energy level, a first valence band energy level, and a first bandgap energy corresponding to an energy difference between a minima of the first conduction band and a maxima of the first valence band energy levels, the semiconductor host matrix further characterized as being capable of conducting electrons and holes through the matrix, and as being substantially non-absorbing of visible wavelengths;

a plurality of semiconductor particles disposed in the semiconductor host matrix, at least a portion of the semiconductor particle plurality being characterized by a second conduction band energy level that is less than the first conduction band energy level, and further being characterized by a second valence band energy level and a second bandgap energy corresponding to an energy difference between a minima of the second conduction band and a maxima of the second valence band energy levels; and means for providing electrons and holes in the host matrix to be conducted through the matrix to locations of the semiconductor particles for recombination at such locations between the second conduction band minima and the second valence band maxima to produce visible-wavelength luminescent radiation.

2. The electroluminescent display device of claim 1 wherein the second bandgap energy is less than the first bandgap energy.

3. The electroluminescent display device of claim 1 wherein an electron-hole recombination time characteristic of the semiconductor host matrix is longer than an electron-hole recombination time characteristic of the semiconductor particles disposed in the host matrix.

4. The electroluminescent display device of claim 1 wherein the semiconductor particles are characterized by a second conduction band minima wave vector that is coincident with a second valence band maxima wave vector.

5. The electroluminescent display device of claim 1 wherein a portion of the plurality of semiconductor particles is characterized by a third conduction band energy level distinct from the second conduction band energy level and less than the first conduction band energy level, and further is characterized by a third valence band energy level distinct from the second valence band energy level, and a third bandgap energy corresponding to an energy difference between a minima of the third conduction band and a maxima of the third valence band energy levels.

6. The electroluminescent display device of claim 5 wherein the second bandgap energy corresponds to a first selected wavelength of luminescent radiation to be produced by recombination of an electron and hole between the second conduction band minima and the second valence band maxima.

7. The electroluminescent display device of claim 5 wherein the third bandgap energy corresponds to a second selected wavelength of luminescent radiation to be produced by recombination of an electron and hole between the third conduction band minima and the third valence band maxima.

8. The electroluminescent display device of claim 1 wherein the semiconductor host matrix comprises a first host matrix portion characterized by the first conduction band and valence band energy levels and the first bandgap energy, and a second host matrix portion characterized by a fourth conduction band energy level that is greater than the second conduction band energy level, the second host matrix portion further characterized by a fourth valence band energy level and a fourth bandgap energy corresponding to an energy difference between a minima of the fourth conduction band and a maxima of the fourth valence band energy levels.

9. The electroluminescent display device of claim 1 wherein the plurality of semiconductor particles comprises a first portion and a second portion of the plurality, the first portion being characterized by a first average particle extent and the second portion being characterized by a second average particle extent.

10. The electroluminescent display device of claim 1 wherein the plurality of semiconductor particles comprises particles characterized by an average particle extent that is less than about one micron.

11. The electroluminescent display device of claim 10 wherein the plurality of semiconductor particles comprises particles characterized by an average particle extent that is less than about 100 nanometers.

12. The electroluminescent display device of claim 11 wherein the plurality of semiconductor particles comprises particles characterized by an average particle extent that is less than about 10 nanometers.

13. The electroluminescent display device of claim 12 wherein the plurality of semiconductor particles comprises particles characterized by an average particle extent that is less than about 1 nanometer.

14. The electroluminescent display device of claim 1 wherein the semiconductor host matrix comprises a semiconducting polymer.

15. The electroluminescent display device of claim 1 wherein the semiconductor particles comprise silicon particles.

16. The electroluminescent display device of claim 1 wherein the second bandgap energy is between about 2 eV and about 4 eV.

17. The electroluminescent display device of claim 1 wherein the means for providing electrons and holes comprises means for applying an electric field between ends of the semiconductor host matrix.

18. The electroluminescent display device of claim 17 wherein the means for applying an electric field between ends of the semiconductor host matrix comprises a circuit configured to apply a voltage across the semiconductor host matrix.

19. A visible-wavelength electroluminescent display device comprising:

a semiconductor host matrix configured to provide a source of holes and electrons by conduction of holes and electrons through the matrix, and characterized as being substantially non-absorbing of visible wavelengths; and a plurality of display pixels configured in the host matrix, each display pixel comprising a plurality of semiconductor particles having a first selected bandgap energy between a particle conduction band minima energy level and a particle valence band maxima energy level, the first selected particle bandgap energy being less than a bandgap energy characteristic of the semiconductor host matrix and corresponding to an energy of a first selected visible luminescent wavelength to be produced by recombination across a particle bandgap of a hole and an electron provided by the semiconductor host matrix.

20. The electroluminescent display device of claim 19 wherein a portion of the plurality of display pixels each comprises a plurality of semiconductor particles having a second selected bandgap energy between a particle conduction band minima energy level and a particle valence band maxima energy level, the second selected particle bandgap energy being less than a bandgap energy characteristic of the semiconductor host matrix and corresponding to an energy of a second selected visible luminescent wavelength to be produced by recombination across a particle bandgap of a hole and an electron provided by the semiconductor host matrix.

21. An electroluminescent display device capable of emitting visible light upon application of an electric field thereto and having luminescent locations comprising semiconductor particles embedded in a semiconductor host matrix that is configured to provide a source of holes and electrons by conduction of holes and electrons through the matrix, and that is characterized as being substantially non-absorbing of visible wavelengths, the luminescent locations being formed by the steps of:

implantation of the semiconductor particles into the host matrix; and annealing of the implanted semiconductor particles, the annealed semiconductor particles having a selected bandgap energy between a particle conduction band minima energy level and a particle valence band maxima energy level, the selected bandgap energy being less than a bandgap energy characteristic of the semiconductor host matrix and corresponding to an energy of a selected visible luminescent wavelength to be produced by recombination across a particle bandgap of a hole and an electron provided by the semiconductor host matrix.

22. The electroluminescent display device of claim 21 wherein the step of implantation of the semiconductor particles into the host matrix comprises implantation of a first plurality of semiconductor particles at a first implantation dose and implantation of a second plurality of semiconductor particles at a second implantation dose.

23. The electroluminescent display device of claim 22 wherein the step of annealing comprises laser annealing.

* * * * *